United States Patent
Hook et al.

(10) Patent No.: US 6,825,490 B1
(45) Date of Patent: Nov. 30, 2004

(54) ON CHIP RESISTOR CALIBRATION STRUCTURE AND METHOD

(75) Inventors: Terence B. Hook, Jericho, VT (US); Raminderpal Singh, Essex Junction, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,567

(22) Filed: Oct. 9, 2003

(51) Int. Cl.$^7$ .......................... H01L 23/58; G01R 31/26
(52) U.S. Cl. .................. 257/48; 257/532; 257/536; 438/14; 438/17
(58) Field of Search .................... 257/48, 532, 533, 257/536; 438/14, 17, 381, 382

(56) References Cited

U.S. PATENT DOCUMENTS 6,458,611 B1 * 10/2002 Gardner ...................... 438/17

* cited by examiner

*Primary Examiner*—Mark V. Prenty
(74) *Attorney, Agent, or Firm*—Schmeiser, Olsen & Watts; Richard A. Henkler

(57) ABSTRACT

A structure and associated method to determine an actual resistance value of a calibration resistor within a semiconductor device. The semiconductor device comprises a capacitor, a calibration resistor, and a calibration circuit. A voltage applied to the calibration resistor produces a current flow through the calibration resistor to charge the capacitor. The calibration circuit is adapted to measure an actual time required to charge the capacitor. The calibration circuit is further adapted calculate an actual resistance value of the calibration resistor based on the actual time required to charge the capacitor and a capacitance value of the capacitor.

20 Claims, 4 Drawing Sheets

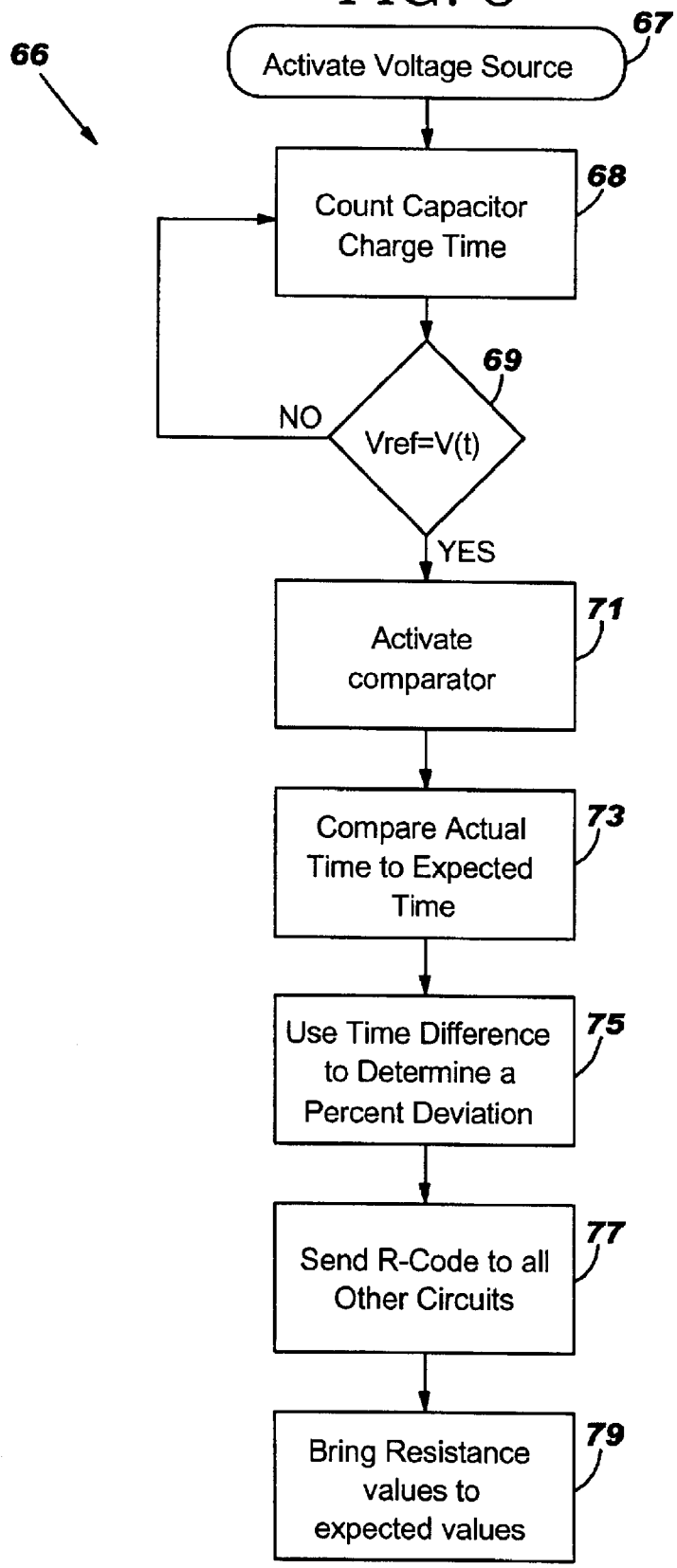

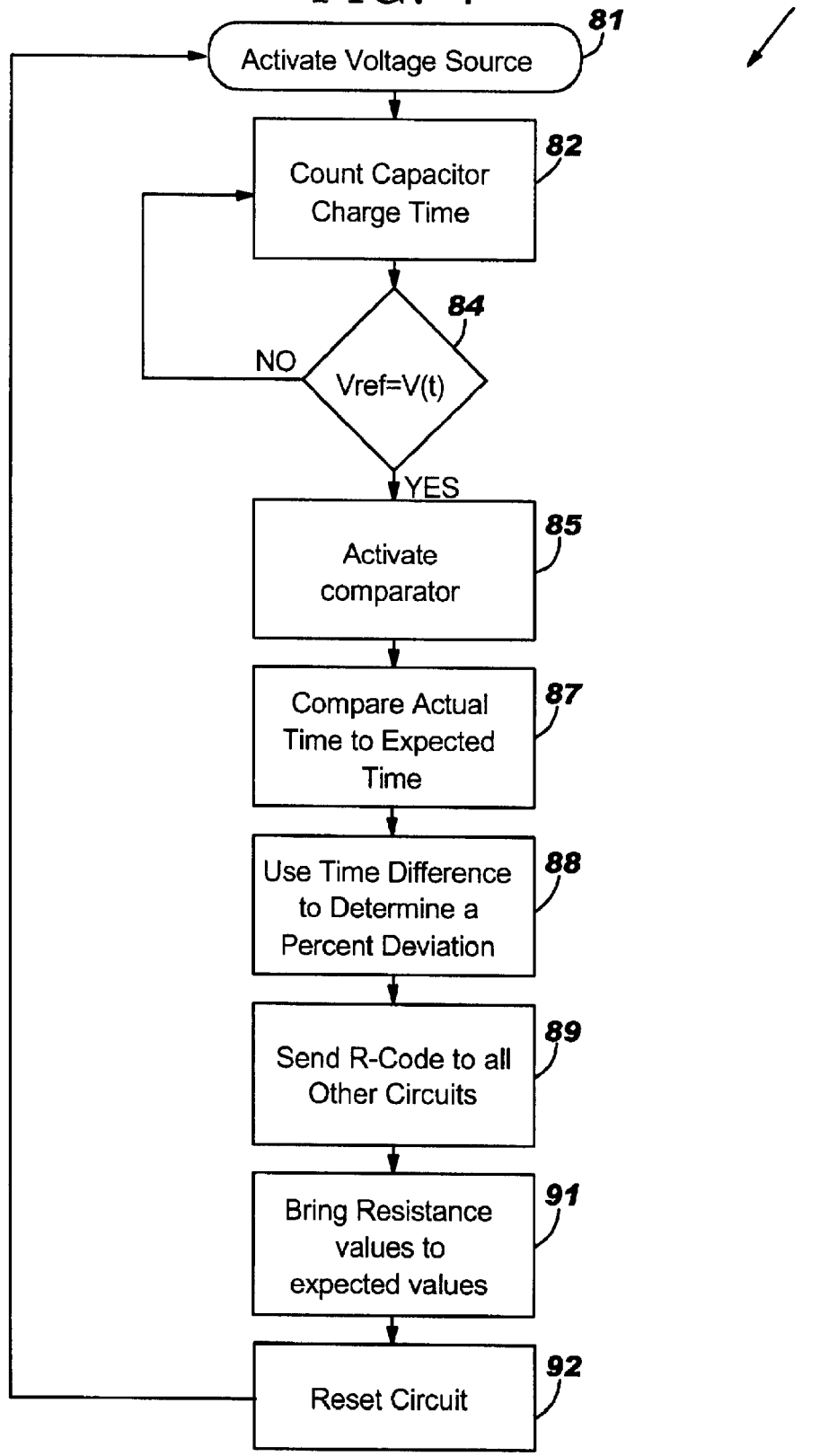

ON CHIP RESISTOR CALIBRATION STRUCTURE AND METHOD

BACKGROUND OF INVENTION

1. Technical Field

The present invention relates to a structure and associated method to calibrate a plurality of resistors on a semiconductor device.

2. Related Art

Electronic components in a circuit typically require correct design values in order to perform a function correctly. Incorrect design values may cause a circuit to malfunction. Therefore there exists a need to provide correct design values in a circuit.

SUMMARY OF INVENTION

The present invention provides a semiconductor device, comprising: a capacitor, a calibration resistor, and a calibration circuit formed within the semiconductor device, wherein a voltage (Vin) applied to the calibration resistor is adapted to produce a current flow through the calibration resistor to charge the capacitor, wherein the calibration circuit is adapted to measure an actual time ($t_{actual}$) required to charge the capacitor, and wherein the calibration circuit is further adapted calculate an actual resistance value ($R_{actual}$) of the calibration resistor based on $t_{actual}$ and a capacitance value (C) of the capacitor.

The present invention provides a calibration method, comprising:

providing a capacitor, a calibration resistor, and a calibration circuit formed within a semiconductor device;

providing a current flow through the calibration resistor to charge the capacitor;

measuring by the calibration circuit, an actual time ($t_{actual}$) required to charge the capacitor; and determining by the calibration circuit, an actual resistance value (R actual) of the calibration resistor based on $t_{actual}$ and a capacitance value (C) of the capacitor.

The present invention advantageously provides an apparatus and method to provide correct design values in a circuit.

BRIEF DESCRIPTION OF DRAWINGS

FIG. 3 is a flowchart depicting an algorithm for determining the expected resistance of the calibration resistor of FIG. 1, in accordance with embodiments of the present invention.

FIG. 4 is a flowchart depicting an algorithm for determining the expected resistance of the variable calibration resistor of FIG. 2, in accordance with embodiments of the present invention.

DETAILED DESCRIPTION

Figure 1:
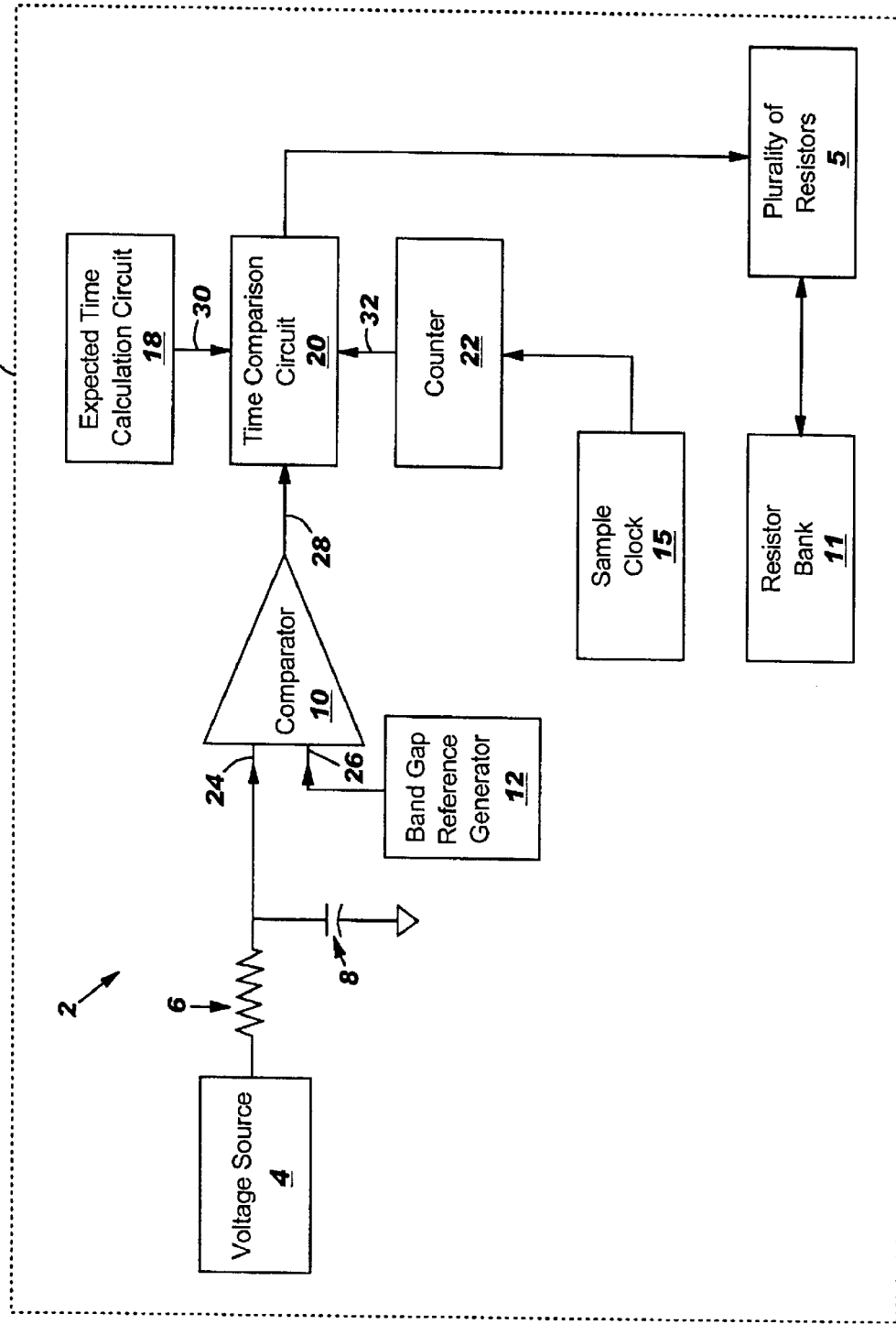
FIG. 1 illustrates a block diagram of a semiconductor device comprising a circuit to determine a resistance value of a calibration resistor, in accordance with embodiments of the present invention.

FIG. 1 illustrates a block diagram of a semiconductor device 1 comprising a circuit 2 to determine an actual resistance value ($R_{actual}$) of a calibration resistor 6, in accordance with embodiments of the present invention. The circuit 2 is adapted to compare $R_{actual}$ to an expected resistance (i.e., design resistance) value ($R_{expected}$) to determine a percentage of deviation of resistance $R_{actual}$ from $R_{expected}$ of the calibration resistor 6. The semiconductor device 1 further comprises a plurality of resistors 5 located at a plurality of locations throughout the semiconductor device 1. The plurality of resistors may be used for, inter alia, transistor biasing, phase lock loop (PLL) circuits, setting currents through charge pumps, input/output (I/O) interface circuits, digital to analog (D/A) convertors, etc. The percentage of deviation of resistance $R_{actual}$ from $R_{expected}$ of the calibration resistor 6 is is about equal (i.e., representative of) to a percentage of deviation of an actual resistance from an expected resistance of each of the resistance values of each of the plurality of resistors 5 within the semiconductor device 1. $R_{actual}$ and $R_{expected}$ are calculated by determining a time (t) that it takes to charge a capacitor 8. A voltage source 4 is activated to supply a voltage (Vin) to the calibration resistor 6 thereby producing a current flow through the calibration resistor 6. The current flow through the calibration resistor 6 charges the capacitor 8. A counter 22 using a sample clock 15 begins to count an actual time ($t_{actual}$) that it takes to charge the capacitor 8. The rate of charge of the capacitor 8 is a function of a resistance value of the calibration resistor 6. A charging voltage (V(t)) applied to a first input 24 of a comparator 10 increases as a function of time by the following charging equation: $V(t)= Vin(1-e^{-t/R*C})$. C in the equation is a capacitance value of the capacitor 8. Therefore, variations of $R_{actual}$ from $R_{expected}$ will result in variations in the rate of charging of the capacitor 8. A band gap reference generator 12 applies a reference voltage (Vref) to a second input 26 of the comparator 10. Vref must be less than Vin in order for the comparator 10 to be activated. When Vref is equal to V(t) the comparator 10 is activated thereby sending a signal over link 28 to a time comparison circuit 20. The time comparison circuit 20 compares the actual time ($t_{actual}$) that it took for the comparator to turn on to an expected time ($t_{expected}$). An expected time calculation circuit 18 calculates $t_{expected}$ using the charging equation: $V(t)=Vin(1-e^{-t/R*C})$, plugging in $R_{expected}$ for R, plugging in Vref for V(t), and solving for t. The expected time calculation circuit 18 transmits $t_{expected}$ over link 30 to the time comparison circuit 20. The magnitude and direction (i.e., positively or negatively) of the offset between $t_{actual}$ and $t_{expected}$ indicates the magnitude and direction (i.e., positively or negatively) of the percentage of deviation of resistance of $R_{actual}$ from $R_{expected}$ using the charging equation. If the capacitor 8 is charged more quickly than expected then $R_{actual}$ is less than $R_{expected}$. If the capacitor 8 is charged more slowly than expected then $R_{actual}$ is greater than $R_{expected}$. The time comparison circuit 20 transmits a signal (R-code) representing the time difference between $t_{actual}$ and $t_{expected}$ (i.e., the percentage of deviation of resistance of $R_{actual}$ from $R_{expected}$) to any circuitry within the semiconductor device 1 comprising any of the plurality of resistors 5. The percentage of deviation of resistance $R_{actual}$ from $R_{expected}$ of the calibration resistor 6 is is about equal to the percentage of deviation of an actual resistance from an expected resistance of each of the resistance values of each of the plurality of resistors 5. Thus, the R-code is used to determine a change of resistance for each of the plurality of resistors 5 in order to bring each of the plurality of resistors 5 to an expected resistance. The semiconductor device 1 further comprises a bank of precision resistors 11. Each precision resistor of the bank of precision resistors 11 is adapted to be connected in series or in parallel with each resistor of the plurality of resistors 5 such that a resistance value of a combination of a first resistor of the plurality of resistors 5 and at least one resistor of the bank of resistors 11 equals an expected resistance value of the first resistor. Each precision resistor of the bank of precision resistors 11 is adapted to be connected in series with a resistor of the plurality of resistors 5 if $R_{actual}$ is less than $R_{expected}$. Each precision resistor in of the bank of precision resistors 11 is adapted to be connected in parallel with a resistor of the plurality of resistors 5 if $R_{actual}$ is greater than $R_{expected}$. The bank of precision resistors are not utilized if $R_{actual}$ equals $R_{expected}$. Each resistor of the bank of resistors 5 may be connected with a resistor of the plurality of resistors 5 by any method known to a person of ordinary skill in the art including, inter alia, selectively opening or closing gates or blowing efuses to trim resistors in parallel or in series with the plurality of resistors, use of a variable field effect transistor type resistors, etc. The calibration resistor 6 may be permanently removed from the semiconductor device 1 after the R code determines the change of resistance value for each of the plurality of resistors 5. Each of the plurality of resistors 5 may comprise a resistance value that is not equal to a resistance value of the calibration resistor 6.

Figure 2:
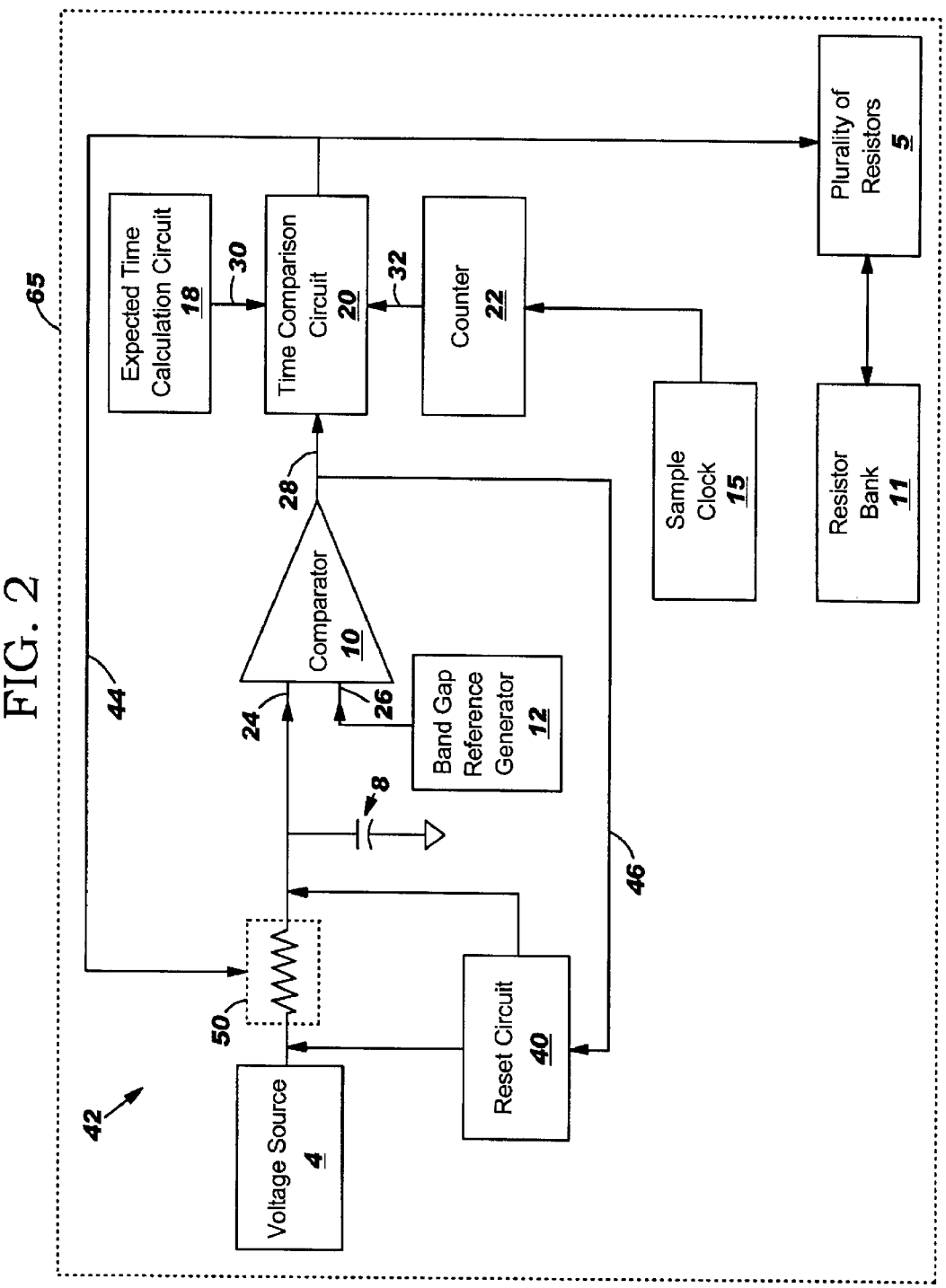
FIG. 2 illustrates a variation of FIG. 1 showing a block diagram of a semiconductor device comprising a circuit to determine a resistance value of a variable calibration resistor, in accordance with embodiments of the present invention.

FIG. 2 illustrates a variation of FIG. 1 showing a block diagram view of a semiconductor device 65 comprising a circuit 42 to determine an actual resistance value ($R_{actual}$) of a variable calibration resistor 50, in accordance with embodiments of the present invention. The circuit 42 determines a percentage of deviation of resistance $R_{actual}$ from an expected resistance value ($R_{expected}$) of the variable calibration resistor 50 using much of the same circuitry as the circuit 2 of FIG. 1. In contrast with FIG. 1, the circuit 42 comprises a feedback loop 44 to iteratively and continuously adjust a resistance of the variable calibration resistor 50. This embodiment allows for adjusting resistance values (i.e., resistance value of the variable calibration resistor 50 or resistance values of each of the plurality of resistors 5) due to temperature fluctuations. The variable calibration resistor 50 may be, inter alia, a series of resistors with a bypass gate in parallel with all but one of the resistors. At the conclusion of a first iteration, some or all of the bypass gates could be open and some or all of the bypass gates could be closed. If the capacitor 8 is charged more quickly than expected then $R_{actual}$ is less than $R_{expected}$ (as described in the description of FIG. 1) and an additional bypass gate would be opened thereby adding resistance by adding a gate in series. If the capacitor 8 is charged more slowly than expected then $R_{actual}$ is greater than $R_{expected}$ (as described in the description of FIG. 1) and an additional gate would be closed thereby lowering the resistance by allowing a bypass to a resistor. When the comparator 10 is activated thereby sending the signal over link 28 to the time comparison circuit 20 (as described in the description of FIG. 1), the comparator 10 also sends the signal over link 46 to a reset circuit 40. The reset circuit 40 is adapted to disable the voltage source 4 while discharging the capacitor 8 so that $t_{actual}$ (i.e., the capacitor 8 charge time) and $R_{actual}$ may be determined again. As described supra in the description of FIG. 1, the time comparison circuit 20 transmits the signal (R-code) representing the time difference between $t_{actual}$ and $t_{expected}$ (i.e., the percentage of deviation of resistance of $R_{actual}$ from $R_{expected}$) to any circuitry within the semiconductor device 65 comprising any resistor of the plurality of resistors 5. The percentage of deviation of resistance $R_{actual}$ from $R_{expected}$ of the variable calibration resistor 50 is is about equal to the percentage of deviation of an actual resistance from an expected resistance of each of the resistance values of each of the plurality of resistors 5. Thus, the R-code is used to determine a change of resistance for each of the plurality of resistors 5 in order to bring each of the plurality of resistors 5 to an expected resistance. The R-code is also used to determine a change of resistance for the variable calibration resistor 50 in order to bring a resistance value of the variable calibration resistor 50 to $R_{expected}$. The circuit 42 iteratively and continuously determines R-code so that the resistance value $R_{expected}$ of the variable calibration resistor 50 and the resistance value of each resistor in the plurality of resistors within the semiconductor device 65 may be continuously adjusted to bring a resistance of the variable calibration resistor 50 to R and a resistance value of each of expected the plurality of resistors to an expected resistance thereby accounting for any resistance changes due to environmental factors such, as inter alia, temperature fluctuations within the semiconductor device 65.

FIG. 3 is a flowchart depicting an algorithm 66 to determine the actual resistance value ($R_{actual}$) of the calibration resistor 6 of FIG. 1, in accordance with embodiments of the present invention. In step 67, the voltage source 4 is activated and a current flow through the calibration resistor 6 charges the capacitor 8. In step 68 while the capacitor 8 is charging, the sample clock 15 and the counter 22 count the capacitor 8 charge time ($t_{actual}$). If Vref does not equal V(t) in step 69, then the capacitor 8 is not yet sufficiently charged and step 68 is repeated. If Vref does equal V(t) in step 69, then the capacitor 8 is charged and the comparator 10 is activated in step 71. In step 73, the calculated expected charge time ($t_{expected}$) from the calculation circuit 18 is compared to $t_{actual}$ and the difference is used to determine the percentage of deviation of resistance $R_{actual}$ from $R_{expected}$ of the calibration resistor 6 in step 75. In step 77, the percentage of deviation of resistance $R_{actual}$ from $R_{expected}$ of the calibration resistor 6 about equals a percentage of deviation of an actual resistance from an expected resistance of each of the resistance values of each of the plurality of resistors 5 within the semiconductor device 1. Thus, a signal (R code) representing the percentage of deviation is sent to any circuits on the semiconductor device 1 that comprise at least one of the plurality of resistors 5. In step 79, a first resistor of the plurality of resistors 5 is combined (i.e., in parallel or series) with at least one resistor of the bank of resistors 11 such that the combination equals an expected resistance value of the first resistor of the plurality of resistors 5.

FIG. 4 is a flowchart depicting an algorithm 80 for determining the actual resistance value ($R_{actual}$) of the variable calibration resistor 50 of FIG. 2, in accordance with embodiments of the present invention. In step 81, the voltage source is activated and a current flow through the variable calibration resistor 50 charges the capacitor 8. In step 82 while the capacitor 8 is charging, the sample clock 15 and the counter 22 count the capacitor 8 charge time ($t_{actual}$). If Vref does not equal V(t) in step 84, then the capacitor 8 is not yet sufficiently charged and step 82 is repeated. If Vref does equal V(t) in step 84, then the capacitor 8 is charged and the comparator is activated in step 85. In step 87, the calculated expected charge time (t expected) from the calculation circuit 18 is compared to $t_{actual}$ and the difference is used to determine the percentage of deviation of resistance $R_{actual}$ from $R_{expected}$ of the variable calibration resistor 50 in step 88. The percentage of deviation of resistance $R_{actual}$ from $R_{expected}$ of the variable calibration resistor 50 about equals a percentage of deviation of an actual resistance from an expected resistance of each of the resistance values of each of the plurality of resistors 5 within the semiconductor device 65. Thus, a signal (R code) representing the percentage of deviation is sent to any circuits on the semiconductor device 65 that comprise at least one of the plurality of resistors 5 in step 89. In step 89, the R code is also sent to the variable calibration resistor 50. In step 91, a first resistor of the plurality of resistors 5 is combined (i.e., in parallel or series) with at least one resistor of the bank of resistors 11 such that the combination equals an expected resistance value of the first resistor of the plurality of resistors 5. In step 91, a second resistor of the plurality of resistors 5 is combined (i.e., in parallel or series) with the variable calibration resistor 50 such that the combination equals $R_{expected}$ of the variable calibration resistor 50. In step 92, the circuit 42 is reset by disabling the voltage source 4 while discharging the capacitor 8 and upon said discharging the voltage source is enabled so that the charge time of the capacitor 8 may be determined again. The circuit 42 iteratively and continuously determines the R-code so that the resistance value $R_{actual}$ of the variable calibration resistor 50 and the resistance values of the plurality of resistors within the semiconductor device 65 may be continuously adjusted to bring the variable calibration resistor 50 and the plurality of resistors to an expected resistance thereby accounting for any resistance changes due to environmental factors such, as inter alia, temperature fluctuations within the semiconductor device 65.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor device, comprising:
a capacitor, a calibration resistor, and a calibration circuit formed within the semiconductor device, wherein a voltage (Vin) applied to the calibration resistor is adapted to produce a current flow through the calibration resistor to charge the capacitor, wherein the calibration circuit is adapted to measure an actual time ($t_{actual}$) required to charge the capacitor, and wherein the calibration circuit is further adapted calculate an actual resistance value ($R_{actual}$) of the calibration resistor based on $t_{actual}$ and a capacitance value (C) of the capacitor.

2. The semiconductor device of claim 1, wherein the calibration circuit is further adapted to calculate an expected time ($t_{expected}$) to charge the capacitor based on an expected resistance value ($R_{expected}$) of the calibration resistor and C.

3. The semiconductor device of claim 2, wherein the calibration circuit is further adapted to determine a time differential ($\Delta t$) between $t_{actual}$ and $T_{expected}$, and wherein $\Delta t$ is adapted to determine a percentage of deviation of resistance $R_{actual}$ from $R_{expected}$ of the calibration resistor.

4. The semiconductor device of claim 3, wherein the semiconductor device further comprises a plurality of resistors, and wherein each of the plurality of resistors comprises a percentage of deviation of resistance of an actual resistance from an expected resistance that is about equal to the percentage of deviation of resistance $R_{actual}$ from $R_{expected}$ of the calibration resistor.

5. The semiconductor device of claim 4, wherein $\Delta t$ is further adapted to determine a change of resistance value for each of the plurality of resistors.

6. The semiconductor device of claim 5, wherein each of the plurality of resistors comprises a resistance value that is not equal to a resistance value of the calibration resistor.

7. The semiconductor device of claim 5, wherein the calibration resistor is adapted to be permanently removed from the semiconductor device after $\Delta t$ determines the change of resistance value for each of the plurality of resistors.

8. The semiconductor device of claim 5, wherein the semiconductor device further comprises a bank of resistors, and wherein each of the bank of resistors is adapted to be connected in series or in parallel with each of the plurality of resistors such that a resistance value of a combination of a first resistor of the plurality of resistors and at least one resistor of the bank of resistors equals an expected resistance value of the first resistor.

9. The semiconductor device of claim 5, wherein the calibration circuit is adapted to continuously determine $\Delta t$, wherein $\Delta t$ continuously determines a change of resistance value for the calibration resistor, and wherein $\Delta t$ continuously determines the change of resistance value for each of the plurality of resistors.

10. The semiconductor device of claim 9, wherein the semiconductor device further comprises a bank of resistors, wherein each of the bank of resistors is adapted to be connected in series or in parallel with each of the plurality of resistors such that a resistance value of a combination of a first resistor of the plurality of resistors and at least one resistor of the bank of resistors equals an expected resistance value of the first resistor, and wherein each of the bank of resistors is further adapted to be connected in series or in parallel with the calibration resistor such that a resistance value of a combination of the calibration and at least one resistor of the bank of resistors equals $R_{expected}$ of the calibration resistor.

11. A calibration method, comprising:
providing a capacitor, a calibration resistor, and a calibration circuit formed within a semiconductor device;
providing a current flow through the calibration resistor to charge the capacitor;
measuring by the calibration circuit, an actual time ($t_{actual}$) required to charge the capacitor; and
determining by the calibration circuit, an actual resistance value ($R_{actual}$) of the calibration resistor based on $t_{actual}$ and a capacitance value (C) of the capacitor.

12. The method of claim 11, further comprising calculating by the calibration circuit an expected time ($t_{expected}$) to charge the capacitor based on an expected resistance value ($R_{expected}$) of the calibration resistor and C.

13. The method of claim 12, further comprising determining by the calibration circuit, a time differential ($\Delta t$) between $t_{actual}$ and $t_{expected}$, and determining from $\Delta t$, a percentage of deviation of resistance $R_{actual}$ from $R_{expected}$ of the calibration resistor.

14. The method of claim 13, further comprising providing a plurality of resistors within the semiconductor device, wherein each of the plurality of resistors comprises a percentage of deviation of resistance of an actual resistance from an expected resistance that is about equal to the percentage of deviation of resistance $R_{actual}$ from $R_{expected}$ of the calibration resistor.

15. The method of claim 14, further comprising determining from $\Delta t$, a change of resistance value for each of the plurality of resistors.

16. The method of claim 15, wherein each of the plurality of resistors comprises a resistance value that is not equala resistance value of the calibration resistor.

17. The method of claim 15, further comprising permanently removing the calibration resistor from the semiconductor device after determining from Δt the change of resistance value for each of the plurality of resistors.

18. The semiconductor device of claim 15, further comprising a bank of resistors within the semiconductor device; and
connecting at least one resistor from the bank of resistors in series or in parallel with at least one of the plurality of resistors such that a resistance value of a combination of a first resistor of the plurality of resistors and at least one resistor of the bank of resistors equals an expected resistance value of the first resistor.

19. The method of claim 15, further comprising continuously determining by the calibration circuit, Δt;
continuously determining from Δt, a change of resistance value for the calibration resistor; and
continuously determining from Δt, the change of resistance value for each of the plurality of resistors.

20. The method of claim 19, further comprises a bank of resistors within the semiconductor device;
connecting at least one resistor from the bank of resistors in series or in parallel with at least one of the plurality of resistors such that a resistance value of a combination of a first resistor of the plurality of resistors and at least one resistor of the bank of resistors equals an expected resistance value of the first resistor; and
connecting at least one resistor from the bank of resistors in series or in parallel with the calibration resistor such that a resistance value of a combination of the calibration and at least one resistor of the bank of resistors equals $R_{expected}$ of the calibration resistor.

* * * * *